(12) United States Patent
Martin et al.

(10) Patent No.: US 7,075,288 B2
(45) Date of Patent: Jul. 11, 2006

(54) SYSTEM AND METHOD FOR ACQUIRING VOLTAGES AND MEASURING VOLTAGE INTO AND ELECTRICAL SERVICE USING A NON-ACTIVE CURRENT TRANSFORMER

(75) Inventors: Brent T. Martin, Walhalla, SC (US); Michael E. Moore, Central, SC (US); Daniel M. Lakich, Walhalla, SC (US)

(73) Assignee: Itron, Inc., West Union, SC (US)

( * ) Notice: Subject to any disclaimer, the term of this patent is extended or adjusted under 35 U.S.C. 154(b) by 0 days.

(21) Appl. No.: 10/881,740

(22) Filed: Jun. 30, 2004

(65) Prior Publication Data

US 2005/0110480 A1    May 26, 2005

Related U.S. Application Data

(60) Provisional application No. 60/484,065, filed on Jul. 1, 2003.

(51) Int. Cl.
*G01R 11/32* (2006.01)

(52) U.S. Cl. .................. 324/142; 324/127; 324/117 R
(58) Field of Classification Search ........ 324/126–127, 324/117 R, 117 H, 142, 654, 158.1; 323/356–358; 336/145–147, 170
See application file for complete search history.

(56) References Cited

U.S. PATENT DOCUMENTS

| 4,939,451 A | * | 7/1990 | Baran et al. ................. 324/127 |
| 5,369,355 A | * | 11/1994 | Roe ............................ 323/356 |
| 6,154,037 A | * | 11/2000 | Ashley et al. ............... 324/623 |
| 6,674,278 B1 | * | 1/2004 | Uesugi ........................ 324/127 |
| 6,754,616 B1 | * | 6/2004 | Sen et al. ..................... 703/13 |
| 2004/0090220 A1 | * | 5/2004 | De Vries et al. ......... 324/103 R |

OTHER PUBLICATIONS

Pages 273-362 of *Handbook for Electricity Metering*, Ninth Edition, copyright 1992 by Edition Electric Institute no month.
PCT International Search Report of corresponding international application, PCT/US04/21088, dated May 2, 2005.

* cited by examiner

*Primary Examiner*—Minh N. Tang
(74) *Attorney, Agent, or Firm*—Dority & Manning, P.A.

(57) ABSTRACT

A voltage acquisition circuit for sensing input voltage signals in each phase of an electrical service includes a non-active current transformer configuration that is operable over a wide input voltage range. The current transformer configuration includes primary and secondary windings, an input resistor and a burden resistor across which an output voltage is defined. The input resistor may be relatively large, such as on the order of about one MΩ and the transformer core may have a nanocrystalline core characterized by predictable magnetic properties versus varied transformer flux levels. This operational predictability facilitates phase compensation via digital filtering or otherwise for any phase shift induced between input and output voltages of the current transformer.

25 Claims, 4 Drawing Sheets

_US 7,075,288 B2_

SYSTEM AND METHOD FOR ACQUIRING VOLTAGES AND MEASURING VOLTAGE INTO AND ELECTRICAL SERVICE USING A NON-ACTIVE CURRENT TRANSFORMER

CROSS REFERENCE TO RELATED APPLICATIONS

This application claims priority under 35 USC 119(e) of Provisional Patent Application Ser. No. 60/484,065 filed Jul. 1, 2003, entitled "SYSTEM AND METHOD OF MEASURING VOLTAGE INTO AN ELECTRICAL SERVICE USING A NON-ACTIVE CURRENT TRANSFORMER," which is hereby incorporated by reference in its entirety.

BACKGROUND OF THE INVENTION

The present subject matter generally concerns voltage acquisition technology that can be utilized to measure voltage signals into an electrical service (with the present subject matter adapted for either single phase or multi-phase, as determined by a user's needs). More particularly, the subject voltage acquisition technology corresponds to non-active current transformers that provide effective voltage sensing over a wide input voltage range. Different embodiments and aspects of the present subject matter may equally take the form of either apparatus or methodology.

Utility providers employ various meters and corresponding measurement circuitry to monitor the amount of electrical energy generated by or distributed to various service locations. Such locations may be respectively characterized by one of many different single-phase or polyphase service types, corresponding to such common metering voltages as 120, 240, 277 and 480 volts. Some conventional electricity meters have been designed to function at all of these common metering voltages, thus operable over a wide input voltage range. Due to industry standards that often require meter accuracy at a range from about twenty percent below the minimum metered voltage value to about twenty percent above the maximum metered voltage value, meters operable in a full wide input voltage range correspond to those that are fully functional in an overall dynamic range of about 96 volts–576 volts.

Electricity meters typically include some sort of input circuitry for receiving voltage and current signals at the electrical service. Input circuitry for receiving the electrical service current signals is referred to herein as current acquisition circuitry, while input circuitry for receiving the electrical service voltage signals is referred to as voltage acquisition circuitry.

Many different components have conventionally been used in meter voltage acquisition circuitry, including respective voltage transformer, active current transformer, and resistive voltage divider configurations. Voltage transformer configurations utilized to measure the voltage for an electrical service are typically only able to measure at one voltage level, and not over the dynamic range of 96–576 volts. Known voltage acquisition circuitry that utilizes active current transformers require at least three windings to accurately measure voltage signals over a dynamic input voltage range. Both such known exemplary voltage acquisition circuitry configurations may also be relatively large and expensive, thus making them impractical for some electric utility meter embodiments. Additional aspects of instrument transformers, including voltage and current transformers as conventionally utilized in electricity metering applications, are disclosed in pages 273–362 of _Handbook for Electricity Metering_, Ninth Edition, © 1992 by Edison Electric Institute, which is incorporated herein by reference for all purposes.

As such, it is desired to provide voltage acquisition circuitry within feasible size and cost constraints, while also being fully operable over a wide input voltage range. While various aspects and alternative embodiments may be known in the field of electricity metering, no one design has emerged that generally encompasses the above-referenced characteristics and other desirable features associated voltage acquisition in an electrical service and associated metering technology.

BRIEF SUMMARY OF THE INVENTION

The present subject matter recognizes and addresses various of the foregoing shortcomings, and others concerning certain aspects of voltage acquisition in electrical service metering applications. Thus, broadly speaking, a principal object of the present invention is improved voltage acquisition technology (both apparatus and methodology) for measuring voltage into electrical services.

It is another object of the present technology to provide a system and method for accurately measuring the input voltage of an electrical service over a relatively wide input voltage range. Since typical exemplary metering voltages include 120, 240, 277 and 480 volts, functional operation over a range inclusive of 96–576 volts may be preferred in some embodiments. Subsets of this dynamic range or larger inclusive ranges may be preferred in other embodiments.

It is a still further object of the present subject matter to use current transformers in circuitry for measuring input voltage, wherein such current transformers are configured in a non-active fashion requiring only first and second windings. A smaller, more cost-effective solution is effected by eliminating the need for a third winding to regulate undesired flux levels in the current transformers. To overcome the need for a third winding, core materials for the current transformers are chosen with predictable magnetic properties as a function of increased flux levels. Predictable operation of the current transformer facilitates accurate compensation of any phase shift in the voltage acquisition circuitry.

These objects as well as other various features and aspects of the subject voltage acquisition technology offer a plurality of advantages. Since the current transformers being used sense a relatively small current, the size of the core can be quite small. Since the core cost dominates the cost of the current transformer, this allows the transformer itself to be much cheaper than the traditional transformer solution.

Another advantage of the present subject matter is that the transformer element in the disclosed non-active current transformer configuration is protected from the line voltage by an input resistor, thus facilitating protection of the transformer.

Yet another advantage of the present subject matter is that the disclosed design uses transformer elements that can be kept small enough to easily fit on a meter circuit board, thus reducing the cost of the overall solution.

A still further advantage of the present subject matter is that the same core material with predictable response properties may be employed in current transformers for both the voltage acquisition and current acquisition circuitry. In such instance, the frequency response of the overall meter will be much more accurate and predictable.

Additional objects and advantages of the present subject matter are set forth in, or will be apparent to those of ordinary skill in the art from, the detailed description herein. Also, it should be further appreciated by those of ordinary skill in the art that modifications and variations to the specifically illustrated, referenced, and discussed features and components hereof may be practiced in various embodiments and uses of this invention without departing from the spirit and scope thereof, by virtue of present reference thereto. Such variations may include, but are not limited to, substitution of equivalent means and features, or materials for those shown, referenced, or discussed, and the functional, operational, or positional reversal of various parts, features, or the like.

Still further, it is to be understood that different embodiments, as well as different presently preferred embodiments, of this invention may include various combinations or configurations of presently disclosed features or elements, or their equivalents (including combinations of features or configurations thereof not expressly shown in the figures or stated in the detailed description).

A first exemplary embodiment of the present subject matter relates to a voltage acquisition circuit for use with an electricity meter. Such exemplary voltage acquisition circuit preferably may include a non-active current transformer configuration with first and second windings, an input resistor and a burden resistor. Such exemplary current transformer configuration may, for example only, have a nanocrystalline core (or other core selected in accordance with the present subject matter), and the input resistor may be a relatively high valued resistor, such as on the order of about one $M\Omega$.

In the foregoing exemplary configuration, a voltage (such as to be metered) may be applied to the non-active current transformer configuration such that a current is induced through the transformer's primary winding. Such input current generates a current in the transformer's secondary winding which is then converted back to a voltage signal across a burden resistor provided in parallel across the secondary winding. The voltage signal effected across the burden resistor is a scaled representation of the actual metered voltage and can be measured and processed by other components of an electricity meter to determine power consumption and related quantities.

Another exemplary embodiment of the presently disclosed technology corresponds to an electricity meter having voltage acquisition circuits with non-active current transformers as described above for each phase in a single-phase or polyphase (i.e. multi-phase) electrical service. The exemplary electricity meter embodiment may further include current acquisition circuits, which may also include current transformer configurations, for sensing input current signals in an electrical service. The electricity meter may further include an analog-to-digital (A/D) converter for transforming the sensed voltage and current signals into sampled representations. An additional element of such exemplary electricity meter embodiment corresponds to a microprocessor configured to calculate energy quantities as well as provide any phase compensation for the sensed voltage and/or current signals (e.g., via a digital filter implementation).

The present subject matter equally corresponds to methodology associated with the disclosed voltage acquisition circuitry and metering systems, and thus another exemplary embodiment of the present subject matter corresponds to a method for measuring voltage signals in an electrical service. A first exemplary step in such embodiment corresponds to applying each voltage phase in a given electrical service to the primary winding of a non-active current transformer configuration via an input resistance. Such initial step effectively converts an input voltage into a current signal through the primary winding of the current transformer. The input resistance preceding the transformer's primary winding may be relatively large such that the current through the primary winding is relatively small. A second exemplary step in this embodiment is to obtain an output voltage across a burden resistor coupled to a secondary winding of the current transformer. The burden resistor may be provided in parallel across the second winding, such that the second step effectively converts the current induced in the transformer's secondary winding via the initial current in the first winding back to a voltage value. Each scaled voltage signal obtained in the second exemplary step may then be converted from its analog signal format to a corresponding digital representation. The digital signals may then be further processed to provide phase compensation to account for any phase shift in the current transformer. Other embodiments of the subject methodology may include additional steps, such as those related to subsequent energy quantity calculations.

Additional embodiments of the present subject matter, not necessarily expressed in this summarized section, may include and incorporate various combinations of aspects of features, steps or parts referenced in the summarized objectives above, and/or features, steps or parts as otherwise discussed in this application.

Those of ordinary skill in the art will better appreciate the features and aspects of such embodiments, and others, upon review of the remainder of the specification.

BRIEF DESCRIPTION OF THE SEVERAL VIEWS OF THE DRAWING

A full and enabling description of the presently disclosed technology, including the best mode thereof, directed to one of ordinary skill in the art, is set forth in the specification, which makes reference to the appended figures, in which.

Figure 1:
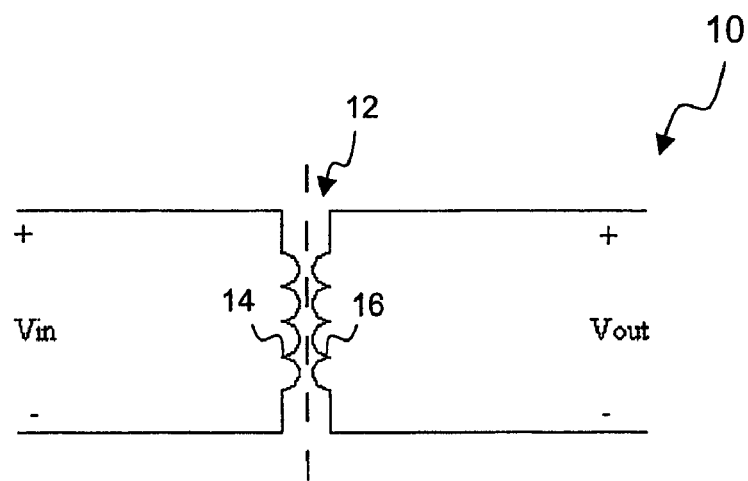
FIG. 1 illustrates a known exemplary voltage acquisition circuit embodiment, using a voltage transformer configuration.

Repeat use of reference characters throughout the present specification and appended drawings is intended to represent same or analogous features, steps or elements of the subject matter.

DETAILED DESCRIPTION OF THE INVENTION

As referenced in the Brief Summary of the Invention section, the present subject matter is directed towards voltage acquisition circuitry, and more particularly to a system and method for measuring voltage into an electrical service and corresponding electricity meter.

Although having particular usefulness for utility meters and electrical service applications, it should be appreciated that the present invention is not limited to this use. Aspects of the invention may be used with other devices or in environments other than an electrical utility service. Such uses may be known or become apparent to those skilled in the art and are within the spirit and scope of the invention. For illustrative purposes, embodiments of the disclosed technology according to the invention may be explained herein as they relate to electrical service metering applications.

Figure 2:
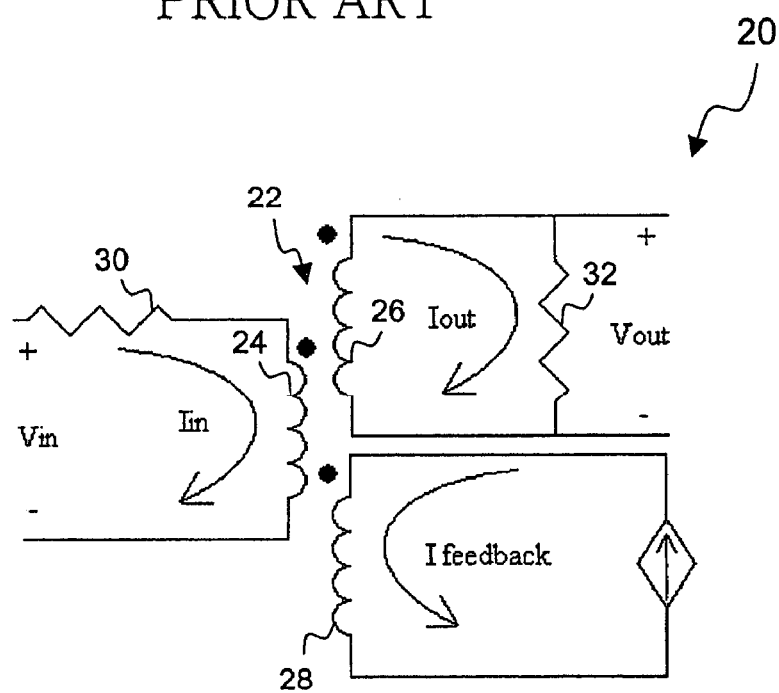
FIG. 2 illustrates a known exemplary voltage acquisition circuit embodiment, using an active current transformer configuration.
Figure 3A:
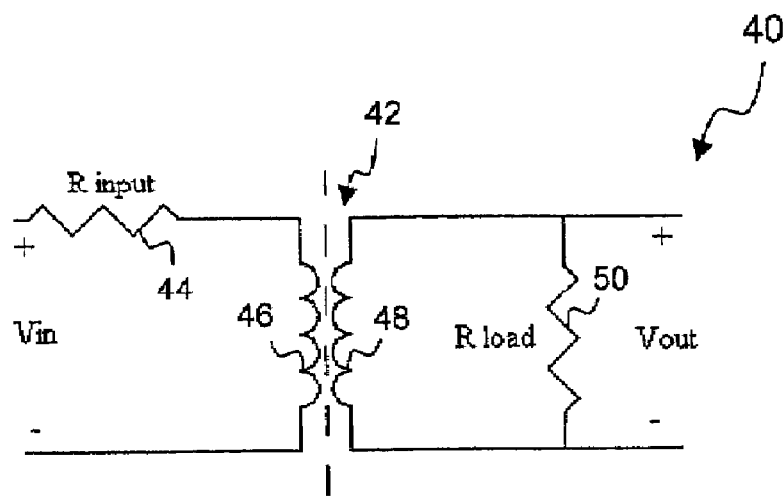
FIGS. 3A and 3B illustrate respective voltage acquisition circuit embodiments in accordance with the presently disclosed technology.
Figure 3B:
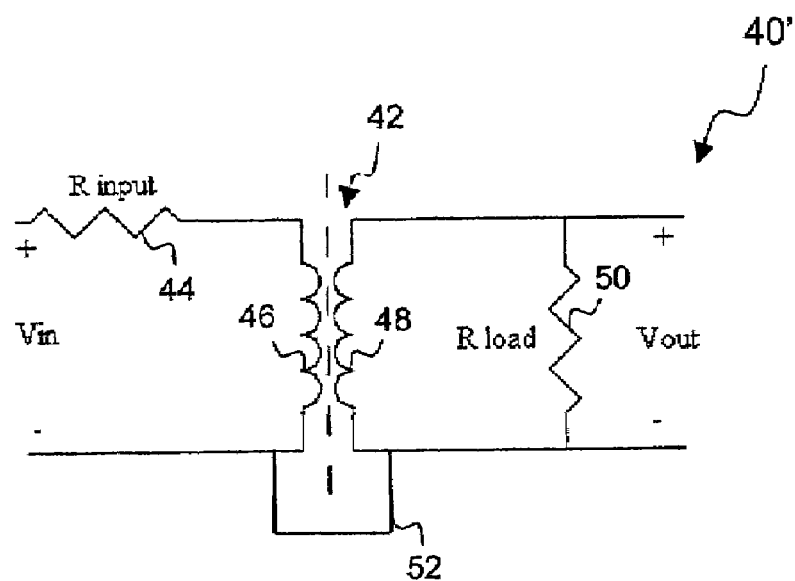
Figure 4:
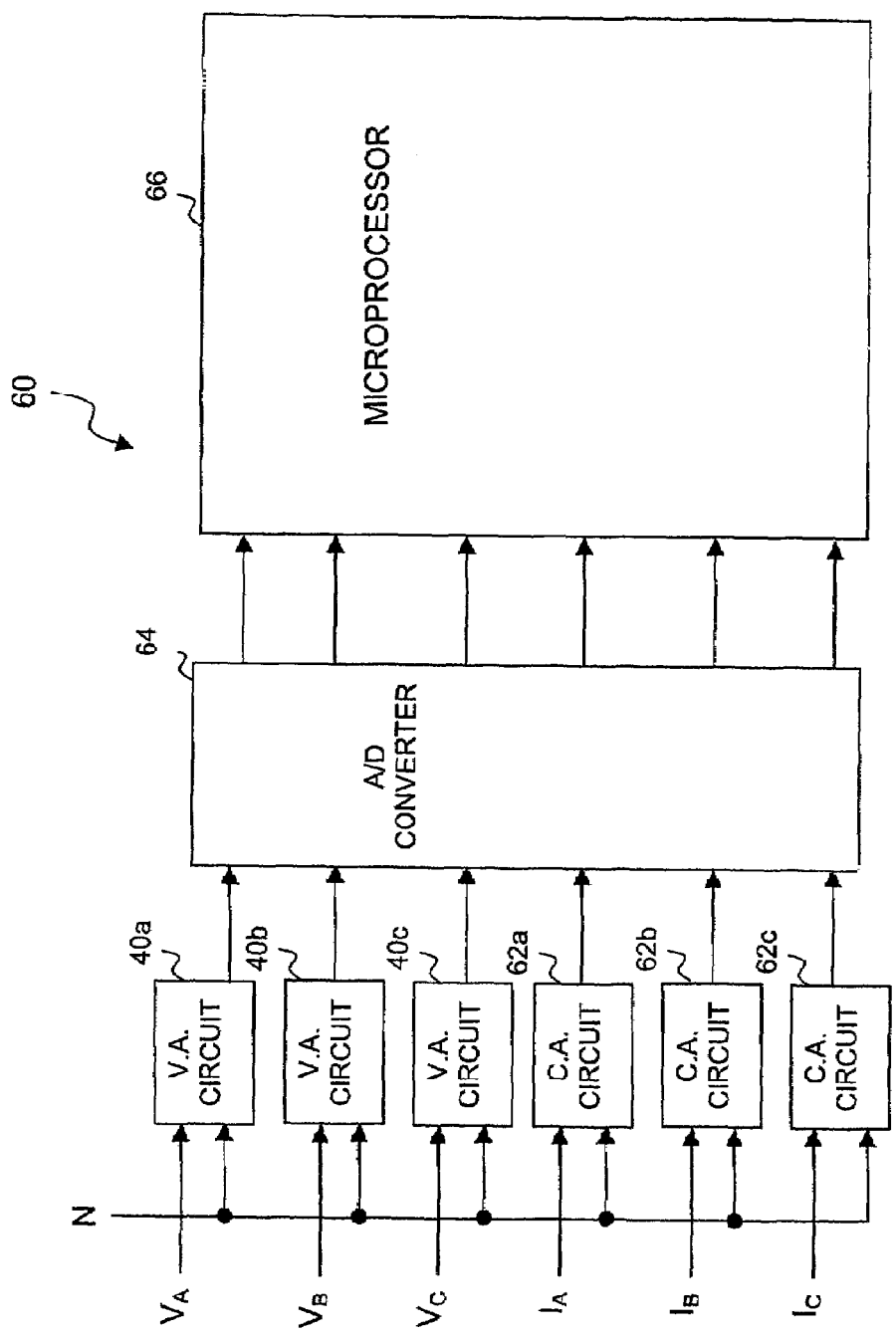
FIG. 4 illustrates exemplary aspects of an electricity meter configuration, including voltage acquisition circuitry in accordance with the presently disclosed technology.
Figure 5:
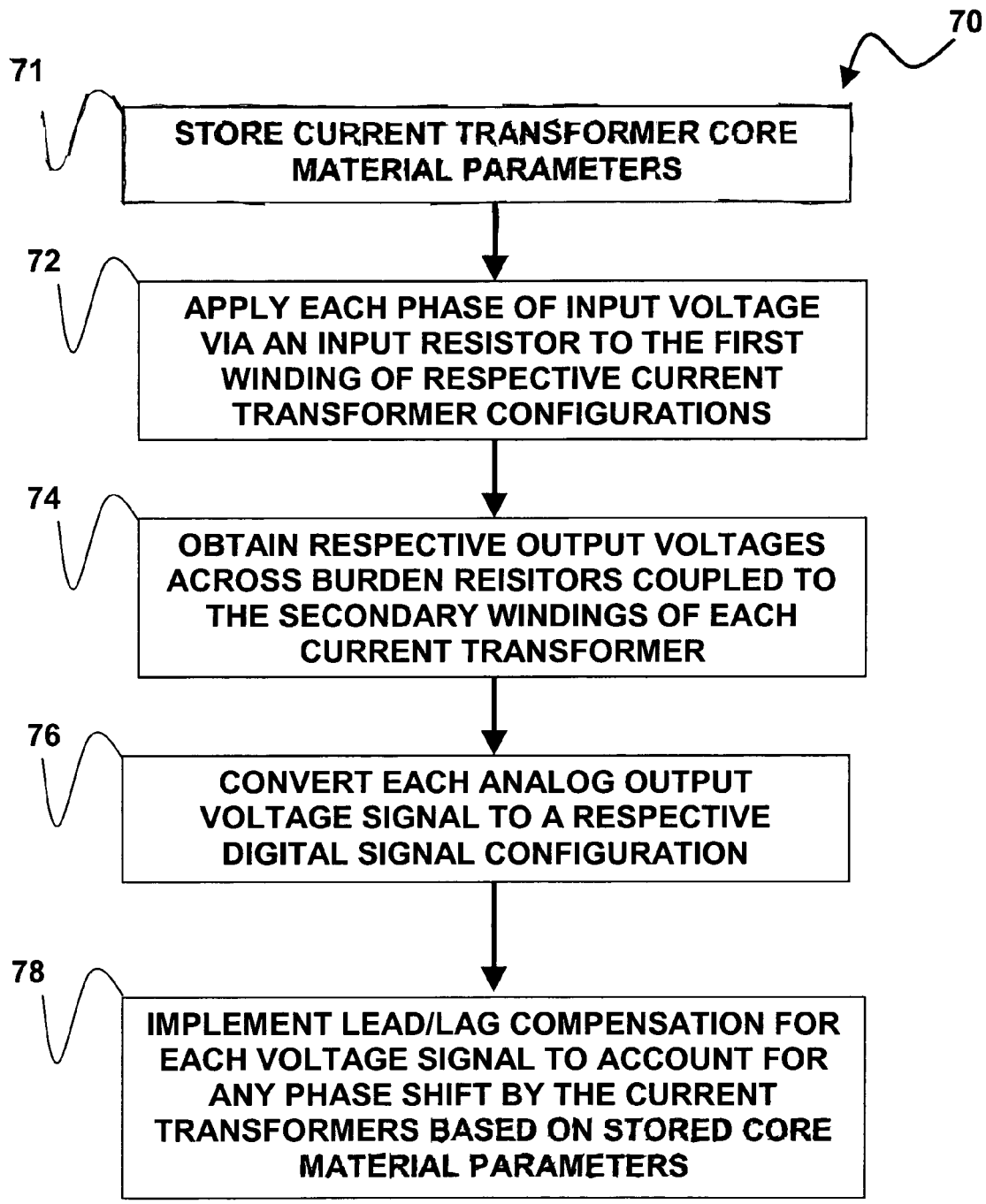
FIG. 5 provides a block diagram illustration of exemplary steps associated with a method of measuring voltage signals into an electrical service.

Aspects of known exemplary embodiments of voltage acquisition circuitry are illustrated in FIGS. 1 and 2, while an exemplary embodiments of voltage acquisition circuitry in accordance with the present subject matter is illustrated in FIGS. 3A and 3B. Aspects of how voltage acquisition circuitry in accordance with the presently disclosed technology is incorporated with other elements of an electricity meter is depicted in FIG. 4. Exemplary steps and aspects associated with the presently disclosed methodology for measuring voltage into an electrical service is illustrated in FIG. 5.

It should be noted that each of the exemplary embodiments presented and discussed herein should not insinuate limitations of the present subject matter. Features illustrated or described as part of one embodiment may be used in combination with aspects of another embodiment to yield yet further embodiments. Additionally, certain features may be interchanged with similar devices or features not expressly mentioned which perform the same or similar function.

Referring now to FIG. 1, an exemplary prior art voltage acquisition circuit 10 as schematically illustrated, includes a voltage transformer (also commonly referred to as a potential transformer) 12 having primary winding 14 and secondary winding 16. An input voltage $V_{in}$ corresponds to a metering voltage received at a given electrical service, such as corresponding to one of 120, 240, 277 or 480 volts. The output voltage of the voltage transformer $V_{out}$ is determined by the relationship $$\frac{V_{out}}{V_{in}} = N,$$

where N is the turns ratio of the secondary 16 to the primary 14 sides of the voltage transformer 12.

Meters have been designed for years using voltage transformers to measure the voltage for an electrical service. However, these devices are typically very large and expensive and only able to measure at one metering voltage. Such a voltage transformer designed for one particular metering voltage would tend to become saturated as the magnetic field in the transformer increases. Thus, voltage transformers may not be a particularly feasible solution for measuring voltages over a wide dynamic input range, for example 96–576 volts. Furthermore, the size of such voltage transformers, which typically have a very large number of windings, may make it impossible to incorporate into a predetermined area, such as on a meter circuit board.

Yet another known technology for measuring voltage into an electrical service corresponds to the use of an active transformer configuration, such as illustrated schematically in the voltage acquisition circuit 20 of FIG. 2. An exemplary prior art active current transformer was known to be utilized in some versions of a QUANTUM Q-1000 brand meter, as sold by Schlumberger Electricity, Inc. Exemplary known voltage acquisition circuit 20 includes a current transformer 22 having first winding 24, second winding 26 and third winding 28. The input voltage ($V_{in}$) from an electrical service is applied to input resistor 30 and primary winding 24 of transformer 22 such that current $I_{in}$ flows through primary winding 24. An output current $I_{out}$ is generated in the secondary winding 26 of transformer 22 while another current $I_{feedback}$ is generated in third winding 28. The voltage signal that is then provided for the given electrical service and measured by the corresponding meter is $V_{out}$, measured across load resistor, or burden resistor, 32. The relationship of the input voltage to the output voltage is determined by the relationship $$\frac{V_{out}}{V_{in}} = \frac{I_{out} * R_{32}}{I_{in} * R_{30}},$$

where $R_{30}$ and $R_{32}$ are the respective resistances of input resistor 30 and burden resistor 32. This voltage relationship corresponds to a current relationship of $$\frac{I_{in}}{I_{out}} = N,$$

where N is equal to the turns ratio of the secondary 26 to the primary 24 sides of transformer 22.

Such a transformer 22 with three windings as depicted in FIG. 2 is known as an active transformer. Transformer 22 uses third winding 28 to keep the transformer out of saturation and to drive a current $I_{feedback}$ into the transformer 22 that nulls the flux field in the core such that the magnetic flux is kept near zero. The change in flux of a normal transformer causes a problem in the measurement of signals. As the amount of flux in the core changes, the phase difference between the primary and secondary voltage signals changes. The third winding 28 of exemplary voltage acquisition circuit 20 counteracts the flux field that stabilizes the phase relationship from primary winding 24 to secondary winding 26. Such active current transformer 22 requires that the input current ($I_{in}$) be measured and fed back via the third winding using external circuitry, also adding to the size and cost of this solution. The device of FIG. 2 would not be able to measure the voltage signal ($V_{in}$) accurately if it were not for the third winding 28.

A voltage acquisition circuit in accordance with the presently disclosed technology overcomes the need for a third transformer winding and any associated external circuitry as required by the known exemplary circuit of FIG. 2. By eliminating a third winding, a voltage acquisition circuit in accordance with the present invention provides a smaller, more cost effective voltage measurement solution.

Referring now to FIGS. 3A and 3B, respective voltage acquisition circuits 40 and 40' in accordance with the presently disclosed technology uses a current transformer 42 to measure an input voltage $V_{in}$. The input voltage ($V_{in}$) from an electrical service is applied to input resistor 44 and primary winding 46 of transformer 42 such that current $I_{primary}$ flows through primary winding 46. The value of input resistance 44 may typically be relatively high (e.g., on the order of about one MΩ) such that the current through the primary winding 46 is relatively small. A relatively large input resistor also more effectively protects the transformer 42 from higher voltage levels. An output current $I_{secondary}$ is generated in the secondary winding 48 of transformer 42.

The voltage signal that is then provided for the given electrical service and measured by the corresponding meter is $V_{out}$, measured across load resistor, or burden resistor, 50. In some embodiments of the present technology, voltage acquisition circuit 40 may be designed such that $V_{out}$ is between about 0.5–3.0 V peak-to-peak. The relationship of the input voltage to the output voltage is determined by the relationship $$\frac{V_{out}}{V_{in}} = \frac{I_{secondary} * R_{50}}{I_{primary} * R_{44}},$$

where $R_{44}$ and $R_{50}$ are the respective resistances of input resistor 44 and burden resistor 50. This voltage relationship corresponds to a current relationship of $$\frac{I_{primary}}{I_{secondary}} = N,$$

where N is equal to the turns ratio of the secondary 48 to the primary 46 sides of transformer 42.

The present disclosed voltage acquisition circuitry provides an ability to provide circuit isolation, such as effected in the exemplary circuit embodiment 40 of FIG. 3A. However, other embodiments of the presently disclosed non-active current transformer technology may not provide isolation. Such is the case when the respective negative terminals defining the input and output voltage in circuit 40' of FIG. 3B are connected together by lead 52. It should be appreciated that both such exemplary configurations are appreciated in accordance with the present subject matter.

Current transformer 42 is unique in that it does not require a third feedback winding. The material of the core in current transformer 42 preferably corresponds to a high permeability material with predictable magnetic properties as a function of increased flux levels in the transformer. Examples of such a core material correspond to crystalline NiFe, nanocrystalline and amorphous cores, particular examples of which include VITROPERM and VITROVAC brand materials, such as manufactured and sold by Vacuumschmelze GmbH of Germany. More particularly, VITROPERM corresponds to a FE-based nanocrystalline material ($Fe_{73.5}CU_1Nb_3Si_{13.5}B_9$) with very low losses and a linear magnetization curve.

Nanocrystalline materials may be particularly well-suited for certain current transformer embodiments. Nanocrystalline materials may typically be characterized as a two-phase structure in which a fine-crystalline grain with an average diameter of, for example, about 10 to 20 nm is embedded in an amorphous residual phase. The nano-crystalline condition is created by a heat treatment at temperatures greater than about 500 degrees Celsius out of the material condition that is originally amorphous. This structure is responsible for the fact that these materials can reach the highest permeabilities with the lowest coercivities. A noncrystalline core's high electrical resistivity results in extremely low eddy-current losses and excellent frequency behavior and permeability. Additional core characteristics may correspond to a saturation flux density of about 1.2 Tesla and generally favorable thermal properties. The core materials may be formed, for example, in a toroidal strip-wound core configuration.

Voltage acquisition circuitry with a non-active current transformer in accordance with the present invention has several advantages over other traditional designs using transformers. Since the current transformer being used senses a very small current, the size of the transformer core can be relatively small. Since the core cost dominates the cost of the current transformer, this allows the transformer itself to be much cheaper than the traditional transformer solution. Also, the size of the current transformer and other elements of the subject voltage acquisition circuits 40 and 40' can be kept relatively small, thus enabling the circuit 40 or 40' to fit on a meter circuit board, reducing the cost of the overall voltage acquisition solution. Furthermore, if the same core material with predictable response properties is employed in current transformers for both the voltage acquisition and current acquisition circuitry, the frequency response of the overall meter can be much more accurate and predictable.

Voltage acquisition circuits in accordance with the presently disclosed technology, examples of which have been presented in FIGS. 3A and 3B, may be utilized to measure the voltage on each phase of an electrical service. An example of how exemplary voltage acquisition circuit 40 or 40' may be incorporated into a meter embodiment 60 is illustrated in FIG. 4. Exemplary components of a meter 60 are depicted in a three-phase electrical service environment, but it should be appreciated that the subject voltage acquisition circuitry may also be employed in single-phase or other polyphase environments in a similar fashion.

Referring more particularly to FIG. 4, a three-phase electrical service yields voltage and current signals at three phases (A, B and C). The three input voltage signals are referred to as $V_A$, $V_B$ and $V_C$, while the three input current signals are referred to as $I_A$, $I_B$ and $I_C$. Respective voltage acquisition circuits 40a, 40b and 40c respectively receive input voltage signals $V_A$, $V_B$ and $V_C$ and a neutral line input (N) for sensing the input voltages to meter 60. Each voltage acquisition circuit 40a–40c respectively includes at least a non-active current transformer and other circuitry as illustrated in either FIG. 3A or 3B. Current acquisition circuits 62a, 62b and 62c respectively receive input current signals $I_A$, $I_B$ and $I_C$ as well as a neutral line input (N) for sensing the input currents to meter 60. Current acquisition circuits 62a–62c may also correspond to current transformer configurations as are well known in the art for measuring current signals into an electrical service.

The voltage acquisition and current acquisition circuitry of FIG. 4 may be preceded by additional protection devices (not illustrated) such as metal oxide varistors (MOVs), zener diodes, transorb surge protectors, etc. to protect the input circuitry against high voltage transient spikes, such as caused by lightning or other phenomena. After each respective voltage and current input signal is sensed by respective voltage and current acquisition circuits 40a–40c and 62a–62c and thus scaled to an appropriate level for the other circuitry of meter 60, each scaled voltage and current signal may then be relayed to an analog-to-digital (A/D) converter 64, where each respective analog voltage and current signal is sampled into a digital signal representation. A/D converter 64 is preferably characterized by at least 6 channels, although it should be appreciated that a fewer or greater number of channels may be used in accordance with the present subject matter. As understood by one or ordinary skill in the art, multiplexers may be employed with A/D converters having fewer channels.

Still referring to FIG. 4, after voltage and current signals $V_A$, $V_B$, $V_C$, $I_A$, $I_B$ and $I_C$ are converted to digital format via A/D 64, the digital signals are then relayed to at least one microprocessor 66, where various energy quantities may be calculated as understood by those of skill in the art. Various metering calculations, including those relating to real, reactive and/or apparent power calculations, time of use, demand metering, and other quantities may be calculated from the input voltage and current signals at microprocessor 66.

Digital signal processing may also be implemented by microprocessor 66 to compensate for any phase shift in the subject voltage acquisition circuits. The respective current transformers in voltage acquisition circuits 40*a*–40*c* may induce a phase shift between the input and output voltage signals. Phase compensation may be implemented, for example, using a digital filter providing lead/lag compensation control, state space control, or other type of control for the sensed voltage and/or current signals. Since the core materials of each current transformer in voltage acquisition circuits 40*a*–40*c* are chosen for their predictable nature, transfer functions can be established in memory associated with microprocessor 66 that may be implemented by microprocessor 66 to provide a filtering function that compensates for phase shifts between the respective input and output voltages over an entire dynamic range, e.g., about 96–576 volts. Similar phase compensation via digital filtering or otherwise may be effected for potential phase shifts between the respective input and output current signals at current acquisition circuits 62*a*–62*c*, which may occur over an entire dynamic range of about 50 mA–25 A. When phase shifting occurs on both the sensed voltage and current signals, it should be appreciated that phase compensation could be effected on both current and voltage signals, or alternatively on only one set of signals relative to a known phase shift on the other set of signals.

The meter circuitry of FIG. 4 includes exemplary meter components, but it should be appreciated that many more or different components may be included in a meter, and that the subject voltage acquisition circuits may be utilized in a variety of different meter types and configurations. More than one microprocessor may exist in meter 60 to implement signal processing on different functional levels. Also, additional meter components such as internal power supplies, meter storage and communication features, including optical ports, modems, LEDs, LCD displays, RF modules, etc. may also be included.

The systems illustrated in FIGS. 3A, 3B and 4 in accordance with the presently disclosed technology, may correspond to other embodiments such as those concerning related methodology. An exemplary embodiment of the present subject matter, namely a method 70 for measuring voltage signals in an electrical service, is functionally illustrated in FIG. 5. A first exemplary step 71 in such embodiment corresponds to storing current transformer core material related parameters in a memory portion of a microprocessor. As previously pointed out, since the core materials of each current transformer is chosen for its predictable nature, core related parameters can be stored in a memory associated with microprocessor 66 that may be implemented by microprocessor 66 to provide compensation for phase shifts between the respective input and output voltages. A second exemplary step 72 in such embodiment corresponds to applying each voltage phase in a given electrical service to the primary winding of a non-active current transformer configuration via an input resistance. Step 72 effectively converts an input voltage into a current signal through the primary winding of the current transformer. The input resistance preceding the transformer's primary winding may be relatively large such that the current through the primary winding is relatively small. A third exemplary step 74 in method 70 of FIG. 5 is to obtain an output voltage across a burden resistor coupled to a secondary winding of the current transformer. The burden resistor may be provided in parallel across the second winding, such that step 74 effectively converts the current induced in the transformer's secondary winding via the initial current in the first winding back to a voltage. Each scaled voltage signal obtained in step 74 is then converted in step 76 from its analog signal format to a corresponding digital representation. The digital signals are then further processed in step 78 such that lead/lag phase compensation is implemented based on the core material parameters stored in step 71 to account for any phase shift in the current transformer. Other embodiments of the subject methodology may include additional steps, such as those related to subsequent energy quantity calculations.

While the present subject matter has been described in detail with respect to specific embodiments thereof, it will be appreciated that those skilled in the art, upon attaining an understanding of the foregoing may readily produce alterations to, variations of, and equivalents to such embodiments. Accordingly, the scope of the present disclosure is by way of example rather than by way of limitation, and the subject disclosure does not preclude inclusion of such modifications, variations and/or additions to the present subject matter as would be readily apparent to one of ordinary skill in the art.

What is claimed is:

1. A method for acquiring a voltage suitable for measuring voltage over a wide input range, comprising the steps of:
   providing a non-active current transformer, said transformer comprising a primary winding and a secondary winding, each of said windings having first and second connection terminals;
   providing first and second electrical resistors, said resistors each having first and second connection terminals;
   connecting a first terminal of said first electrical resistor to a first terminal of said primary winding of said current transformer;
   connecting said first and second connection terminals of said second resistor to said first and second connection terminals, respectively, of said secondary winding of said current transformer; and
   applying a voltage to be measured across said second connection terminal of said first resistor and said second connection terminal of said primary winding; and
   wherein the step of providing a non-active current transformer further comprises providing a core material thereof selected from the group consisting of crystalline NiFe, nanocrystalline materials, and amorphous materials; and
   wherein said method further comprises the steps of providing an analog to digital converter having first and second input terminals; and
   coupling said first and second terminals of the secondary winding to said first and second terminals, respectively, of said analog to digital converter.

2. The method of claim 1, further comprising the step of:
   selecting a relatively high valued electrical resistor as said first electrical resistor.

3. The method of claim 2, wherein the step of selecting comprises selecting an electrical resistor having a value of about one megaohm(MΩ).

4. The method of claim 1, further comprising the steps of:
   providing a microprocessor, said microprocessor comprising a processor portion and a memory portion; and storing within said memory portion of said microprocessor parameters relating to said core material.

5. The method of claim 4, further comprising the steps of:
calculating predetermined voltage values; and
adjusting said predetermined voltage values according to said parameters relating to said core material.

6. The method of claim 1, wherein said method is used in measuring voltages in multi-phase environments, and wherein a respective non-active current transformer and associated resistors and connections are provided for each phase of such multi-phase environment.

7. A voltage acquisition apparatus for use with an electricity meter, comprising:
a non-active current transformer, said non-active current transformer comprising a primary winding and a secondary winding;
an input electrical resistor coupled in series with the primary winding of said non-active current transformer;
a burden electrical resistor coupled in parallel with the secondary winding of said non-active current transformer; and
further comprising an analog to digital converter having an input and an output, and wherein said input of said converter is coupled to said secondary winding of said non-active current transformer.

8. The voltage acquisition apparatus of claim 7, further connected to an electricity meter for wide input range metering including a microprocessor coupled to said output of said analog to digital converter, said microprocessor comprising a processor portion and a memory portion.

9. The voltage acquisition apparatus of claim 8, wherein:
said non-active current transformer further comprises a core comprising a predetermined material; and further wherein
said memory portion of said microprocessor is configured to store parameters relating to said predetermined material.

10. The voltage acquisition apparatus of claim 9, wherein said processor portion of said microprocessor is configured to calculate predetermined voltage values based in part on said parameters relating to said predetermined material.

11. The voltage acquisition apparatus of claim 10, wherein said processor is configured to calculate phase shift values based on said parameters relating to said predetermined material.

12. The voltage acquisition apparatus of claim 7, wherein:
said apparatus is for use with a multi-phase electricity meter to be used in measuring voltages in multi-phase environments; and wherein
said apparatus includes a plurality of non-active current transformers and associated resistors and couplings, with respective of said non-active current transformers and their associated resistors and couplings associated each with a respective one phase of the multiple phases of the multi-phase environment.

13. An electricity meter for operation with input voltage over a wide input range, comprising in combination:
a non-active current transformer, said non-active current transformer comprising a primary winding and a secondary winding;
an input electrical resistor coupled in series with said primary winding of said non-active current transformer;
a burden electrical resistor coupled in parallel with the secondary winding of said non-active current transformer;

an analog to digital converter having an input and an output, the input coupled to the secondary winding of said non-active current transformer; and
a microprocessor coupled to the output of said analog to digital converter, said microprocessor comprising a processor portion and a memory portion.

14. The electricity meter of claim 13, wherein said non-active current transformer further comprises a core comprising a predetermined material and said memory portion of said microprocessor is configured to store parameters relating to said predetermined material.

15. The electricity meter of claim 14, wherein said processor portion of said microprocessor is configured to calculate predetermined voltage values based in part on said parameters relating to said predetermined material.

16. The electricity meter of claim 15, wherein said processor is configured to calculate phase shift values based on said parameters relating to said predetermined material.

17. The electricity meter of claim 13, wherein:
said electricity meter is a multi-phase electricity meter to be used in measuring voltages in multi-phase environments; and wherein
said electricity meter combination includes a plurality of non-active current transformers and associated resistors and couplings, with respective of said non-active current transformers and their associated resistors and couplings associated each with a respective one phase of the multiple phases of the multi-phase environment.

18. A method for measuring voltage over a wide input range, comprising the steps of:
providing a non-active current transformer, said transformer comprising a primary winding and a secondary winding, each of said windings having first and second connection terminals;
providing first and second electrical resistors, said resistors each having first and second connection terminals;
connecting said first connection terminal of said first electrical resistor to said first connection terminal of said primary winding of said current transformer;
connecting said first and second connection terminals of said second resistor to said first and second connection terminals, respectively, of said secondary winding of said current transformer;
applying a voltage to be measured across said second connection terminal of said first resistor and said second connection terminal of said primary winding;
providing an analog to digital converter having first and second input terminals;
coupling said first and second terminals of said secondary winding to said first and second terminals, respectively, of said analog to digital converter;
providing a microprocessor, said microprocessor comprising a processor portion and a memory portion; and
storing parameters relating to said non-active current transformer within said memory means of said microprocessor.

19. The method of claim 18, further comprising the step of:
selecting a relatively high valued electrical resistor as said first electrical resistor.

20. The method of claim 19, wherein said step of selecting comprises selecting an electrical resistor having a value of about one megaohm(MΩ).

21. The method of claim 18, further comprising the steps of:
calculating predetermined voltage values; and adjusting said predetermined voltage values according to said parameters relating to said non-active current transformer.

22. The method of claim 18, wherein:
said step of providing a non-active current transformer further comprises providing a core material selected from the group consisting of crystalline NiFe, nanocrystalline materials, and amorphous materials.

23. The method of claim 22, wherein:
said step of storing parameters within said memory portion of said microprocessor includes storing parameters relating to said core material of said non-active current transformer.

24. The method of claim 23, further comprising the steps of:
calculating predetermined voltage values; and
adjusting said predetermined voltage values according to said parameters relating to said core material.

25. The method of claim 18, wherein said method is used in measuring voltages in multi-phase environments, and wherein a respective non-active current transformer and associated resistors and connections are provided for each phase of such multi-phase environment.

* * * * *

UNITED STATES PATENT AND TRADEMARK OFFICE
CERTIFICATE OF CORRECTION

PATENT NO. : 7,075,288 B2
APPLICATION NO. : 10/881740
DATED : July 11, 2006
INVENTOR(S) : Martin et al.

It is certified that error appears in the above-identified patent and that said Letters Patent is hereby corrected as shown below:

On the title page item (54) and col. 1, line 3,
After the word "INTO" and before the word "ELECTRICAL", delete the word "AND" and relace with --AN--

Column 12, line 56, after the word "memory", delete the word "means" and replace with --portion--

Signed and Sealed this

Third Day of October, 2006

JON W. DUDAS
*Director of the United States Patent and Trademark Office*